United States Patent
Kischkat

(10) Patent No.: US 9,742,167 B2
(45) Date of Patent: Aug. 22, 2017

(54) PLASTIC INJECTION OVERMOLDED CONDUCTOR PATH STRUCTURE, AND METHOD FOR PRODUCING THE PLASTIC INJECTION OVERMOLDED CONDUCTOR PATH STRUCTURE

(71) Applicant: AUDI AG, Ingolstadt (DE)

(72) Inventor: Ralf Kischkat, Gaimersheim (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/318,578

(22) PCT Filed: May 30, 2015

(86) PCT No.: PCT/EP2015/001100
§ 371 (c)(1),
(2) Date: Dec. 13, 2016

(87) PCT Pub. No.: WO2015/188919
PCT Pub. Date: Dec. 17, 2015

(65) Prior Publication Data
US 2017/0125989 A1    May 4, 2017

(30) Foreign Application Priority Data
Jun. 14, 2014  (DE) .................. 10 2014 008 853

(51) Int. Cl.
*H05K 5/00* (2006.01)
*H01R 13/46* (2006.01)
(Continued)

(52) U.S. Cl.
CPC .............. *H02G 3/04* (2013.01); *B29C 39/02* (2013.01); *B29C 45/1671* (2013.01);
(Continued)

(58) Field of Classification Search
CPC .. H02G 3/04; B29C 45/1671; B29C 45/2628; B29C 39/02; B29K 2995/0005; B29L 2031/3481
(Continued)

(56) References Cited

U.S. PATENT DOCUMENTS 4,627,675 A * 12/1986 Taylor .................. H01R 4/4818
439/535
4,766,520 A * 8/1988 Huber .................... H05K 3/202
361/736
(Continued)

FOREIGN PATENT DOCUMENTS

DE          195 15 622 A1  11/1996
DE   10 2009 047 051 A1   5/2001
(Continued)

OTHER PUBLICATIONS

International Search Report issued by the European Patent Office in International Application PCT/EP2015/001100.

*Primary Examiner* — Sherman Ng
(74) *Attorney, Agent, or Firm* — Henry M. Feiereisen LLC

(57) ABSTRACT

A plastic injection overmolded conductor path structure is disclosed, wherein the conductor paths are entirely surrounded, apart from their connections, by a housing made of plastic, said housing comprising first housing sections produced in a first injection molding process (pre-injection overmolding), and second housing sections which directly adjoin the first housing sections via a contact surface, and which are produced in a second injection molding process (main injection overmolding). The housing is provided with at least one recess of a defined shape and size, in the region of the contact surface.

11 Claims, 3 Drawing Sheets

(51) Int. Cl.
  *H02G 3/04* (2006.01)
  *B29C 45/16* (2006.01)
  *B29C 45/26* (2006.01)
  *B29C 39/02* (2006.01)
  *B29L 31/34* (2006.01)

(52) U.S. Cl.
  CPC .. *B29C 45/2628* (2013.01); *B29K 2995/0005* (2013.01); *B29L 2031/3481* (2013.01)

(58) Field of Classification Search
  USPC .............................................. 174/59; 361/752
  See application file for complete search history.

(56) References Cited

U.S. PATENT DOCUMENTS

| | | | |
|---|---|---|---|
| 4,821,413 A * | 4/1989 | Schmitt | H01R 13/405 264/272.11 |
| 5,285,010 A * | 2/1994 | Huber | H05K 5/0069 174/560 |
| 5,737,188 A | 4/1998 | Flierl et al. | |
| 2003/0116344 A1* | 6/2003 | Gueckel | F16H 61/0006 174/255 |
| 2007/0133183 A1* | 6/2007 | Urbach | H01L 23/49861 361/760 |
| 2008/0012173 A1 | 1/2008 | Asao | |
| 2008/0019106 A1* | 1/2008 | Wetzel | F16H 61/0006 361/752 |
| 2012/0202368 A1 | 8/2012 | Kuroda et al. | |
| 2013/0065719 A1 | 3/2013 | Schenker et al. | |
| 2016/0214292 A1 | 7/2016 | Gerhaeusser et al. | |

FOREIGN PATENT DOCUMENTS

| | | |
|---|---|---|
| DE | 10 2004 020 085 A1 | 11/2005 |
| DE | 10 2009 026 459 A1 | 12/2010 |
| DE | 10 2009 046 467 A1 | 5/2011 |
| DE | 10 2013 217 549 A1 | 3/2015 |
| JP | 2003-36951 | 2/2003 |
| JP | 2008-18633 | 1/2008 |
| JP | 2012-164524 | 8/2012 |
| JP | 2013-168315 | 8/2013 |

* cited by examiner

PLASTIC INJECTION OVERMOLDED CONDUCTOR PATH STRUCTURE, AND METHOD FOR PRODUCING THE PLASTIC INJECTION OVERMOLDED CONDUCTOR PATH STRUCTURE

CROSS-REFERENCES TO RELATED APPLICATIONS

This application is the U.S. National Stage of International Application No. PCT/EP2015/001100, filed May 30, 2015, which designated the United States and has been published as International Publication No. WO 2015/188919 and which claims the priority of German Patent Application, Serial No. 10 2014 008 853.7 filed Jun. 14, 2014, pursuant to 35 U.S.C. 119(a)-(d).

BACKGROUND OF THE INVENTION

The invention relates to a plastic injection overmolded conductor path structure and a method for producing the plastic injection overmolded conductor path.

In the case of large numbers of pieces plastic injection overmolded conductor paths are cost-optimal electrical connection elements, for example as used in transmissions in vehicle construction. Beside the low costs their particular advantage is that they are also capable of carrying great electrical currents and can be easily constructively adjusted to the required powers and geometries. Compared to the connection technology "cable" higher tool costs are required, but the cost per piece is significantly lower.

A generic plastic injection overmolded conductor path is disclosed in DE 10 2004 020 085 A1.

Corresponding methods for producing a plastic injection overmolded conductor path are amply known from the state of the art and include, as for example disclosed in DE 10 2009 026 459 A1, the following method steps:
- stamping/cutting of the conductor paths from a metal sheet, wherein connecting webs are retained at individual sites of the conductor paths in order to prevent the conductor paths from falling apart;
- provision of pre-injection overmoldings: first housing sections are generated from plastic which are intended to prevent the conductor paths from falling apart as soon as the next working step is completed. For this purpose the conductor path packet with the connecting webs is inserted into a plastic injection molding tool and at the sites to be held is overmolded outside the metallic connecting webs;
- removal of the connecting webs, for example by stamping, cutting, bending;
- provision of a main injection overmolding: second housing sections are generated from plastic that border the first housing sections. The second housing sections provide mechanical strength to the conductor paths and insulate the conductors against each other (since they may contact each other and may cause short circuits) and against environmental influences (for example metal chippings, which may also cause short circuits).

Because the plastic is injected under high pressure and high temperatures and the material shrinks during cooling, gaps are generated between the conductor paths and the plastic and between the plastic and the pre- and main injection overmoldings. Through these gaps air and moisture can enter. The gap between the pre- and main injection overmolding normally forms a connecting path between the conductors. When liquids enter the gap this may lead to the formation of a microfilm in the presence of corresponding environmental conditions, such as high temperatures. As a consequence the liquids may "become conductive" which may lead to short circuits. Another possibility for short circuits: reaction products may form as a result of the reaction of the liquids with components in the air, plastic components or conductor path components.

SUMMARY OF THE INVENTION

The invention is based on the object to improve a plastic injection overmolded conductor path structure according to the type set froth in the preamble of the corresponding independent claim so that the risk of short circuits is minimized.

This object is solved by the characterizing features of the corresponding independent claim in connection with the features set forth in its preamble.

The dependent claims form advantageous refinements of the invention.

As is known in the plastic injection overmolded conductor path structure the conductor paths are completely enclosed by a housing made of plastic with the exception of their connections. The housing hereby has two housing sections, i.e., first housing sections which are produced in a first injection molding process—in the following also referred to as pre-injection overmolding—and second housing sections which directly border thereon via a contact surface, which second housing sections are produced in a second injection molding process—in the following also referred to as main injection overmolding.

According to the invention the housing has at least one material recess in the region of the contact surface. The material recess is hereby dimensioned regarding its shape and size so as to enable a liquid exchange with the environment via the material recess.

The configuration according to the invention advantageously ensures that in the region of the contact surface between the two housing sections as a result of the material recess large amounts of liquids can enter/exit so that the formation of a microfilm is avoided, i.e., the risk of a short circuit is thereby significantly reduced.

Preferably the material recess is hereby formed by a bore, which is introduced into the housing from outside and forms an entry opening in the housing surface. The bore can be configured as a through-bore or as a blind hole or blind bore. The configuration of the material recess in the form of a bore is especially advantageous with regard to manufacturing because it can be manufactured cost-effectively. The term "bore" used in this context includes all material recesses introduced into the housing from outside, i.e., also in the form of an opening or a hole.

According to an embodiment of the invention the entry opening or entry openings resulting from the bore(s) in the housing surface are closed again by means of a closure means, in particular in the form of an injection mass. This embodiment is in particular advantageous when there is a risk that a conductor path is no longer covered by a sufficiently thick plastic layer. In particular this significantly reduces the risk of a short circuit resulting from the attachment of contaminant particles.

In a particular embodiment the material recess can also occupy the entire space between the pre-injection overmoldings so that the plastic injection overmolded conductor path structure has the appearance of multiple conductors which have individual insulators and are supported by the overmolding.

Another object of the invention is to provide a method for producing the plastic injection overmolded conductor path structure.

This object is solved by the characterizing features of the corresponding independent claim in connection with the features set forth in its preamble.

The dependent claims form advantageous embodiments of the method.

As is known the method for producing a plastic injection overmolded conductor path structure includes the method steps:

producing conductor paths from a metal sheet, wherein the individual conductor paths are connected with each other via metallic connecting webs;

inserting the conductor paths, which are connected with each other via the connecting webs, into a plastic injection molding tool and applying a pre-overmolding made of plastic material, in which at least two conductor paths in which at least two housing sections are generated which are separate when viewed in longitudinal direction and which fix the conductor paths to each other and are positioned spaced apart from the connecting webs, wherein the pre-overrmolding is exclusively limited to the first housing sections so that regions of the conductor paths are avoided which are situated between two first housing sections;

removal of the connecting webs;

inserting the conductor paths that are fixed spaced apart to each other via the first housing sections into a plastic injection molding tool and applying a main injection overmolding made of plastic material, in which second housing sections are generated which border directly on the first housing sections via contact surfaces and which completely enclose the regions of the avoided regions of the conductor paths.

According to the invention a material recess is introduced in the region of the contact surface between the first and second housing section.

According to a first embodiment the material recess is introduced by a corresponding configuration of the plastic injection molding toot during application of the main injection overmolding. This is advantageous because no further manufacturing steps are required for the introduction of the material recess.

According to another embodiment the material recess is introduced after application of the main injection overmolding by a material-removing manufacturing process.

Preferably this is accomplished by means of drilling, stamping, laser cutting or water jet cutting.

A further advantageous embodiment of the method provides that the entry openings formed by the material recess in the housing surface are closed again, in particular by means of casting with a casting mass.

BRIEF DESCRIPTION OF THE DRAWING

Further advantages, features and applications of the present invention will become more apparent from the following description in connection with the exemplary embodiments shown in the drawings.

In the description, in the claims and in the drawing the terms and associated reference signs are used in the list of reference signs set forth below.

In the drawing it is shown in:

Figure 1:
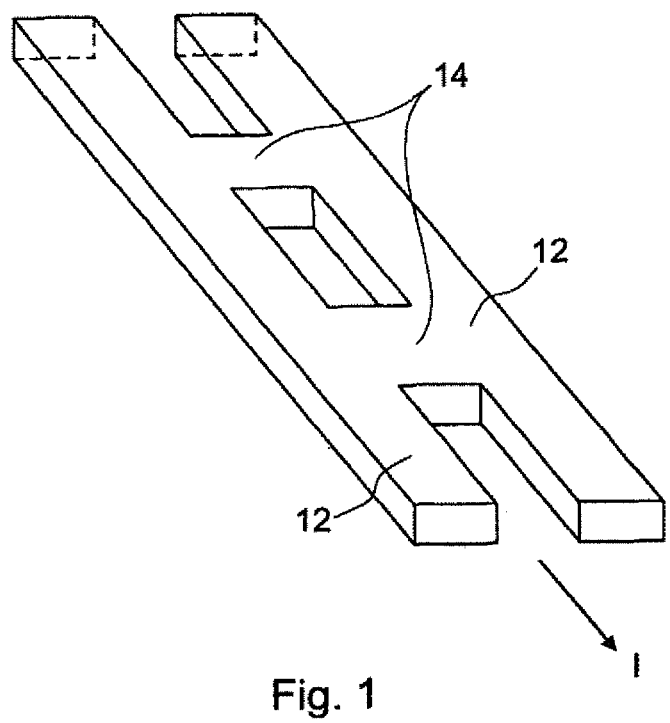
Figure 2:
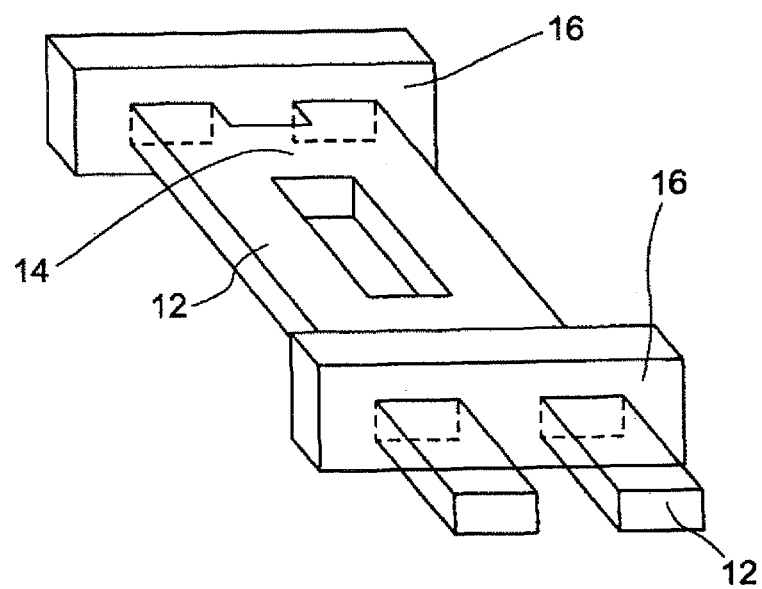
Figure 3:
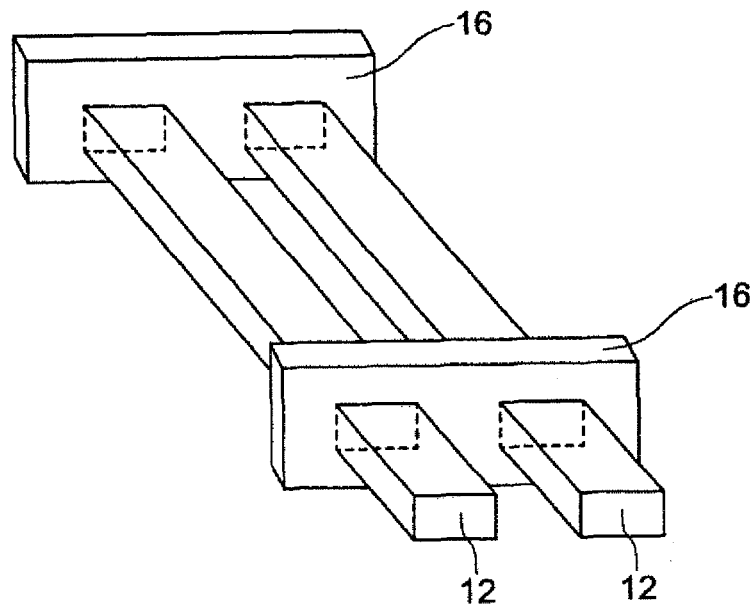
Figure 4:
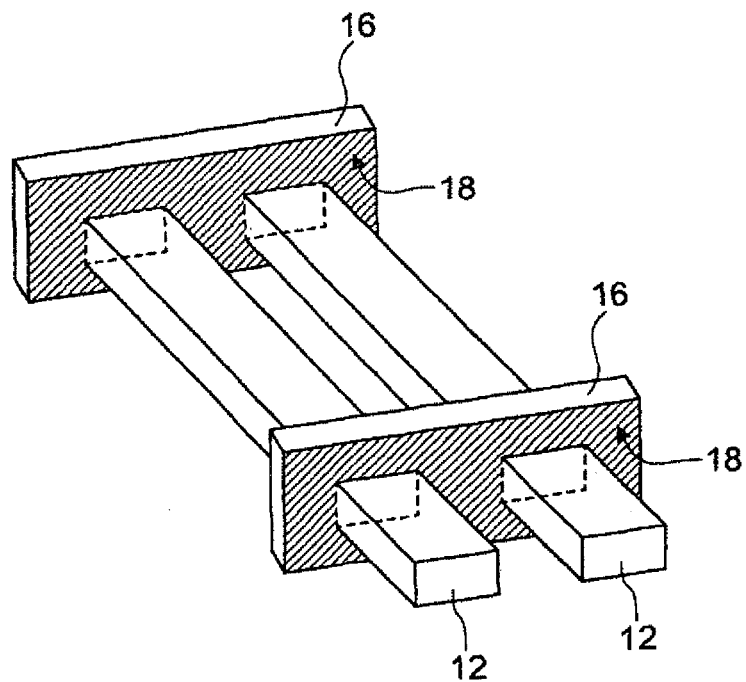
Figure 5:
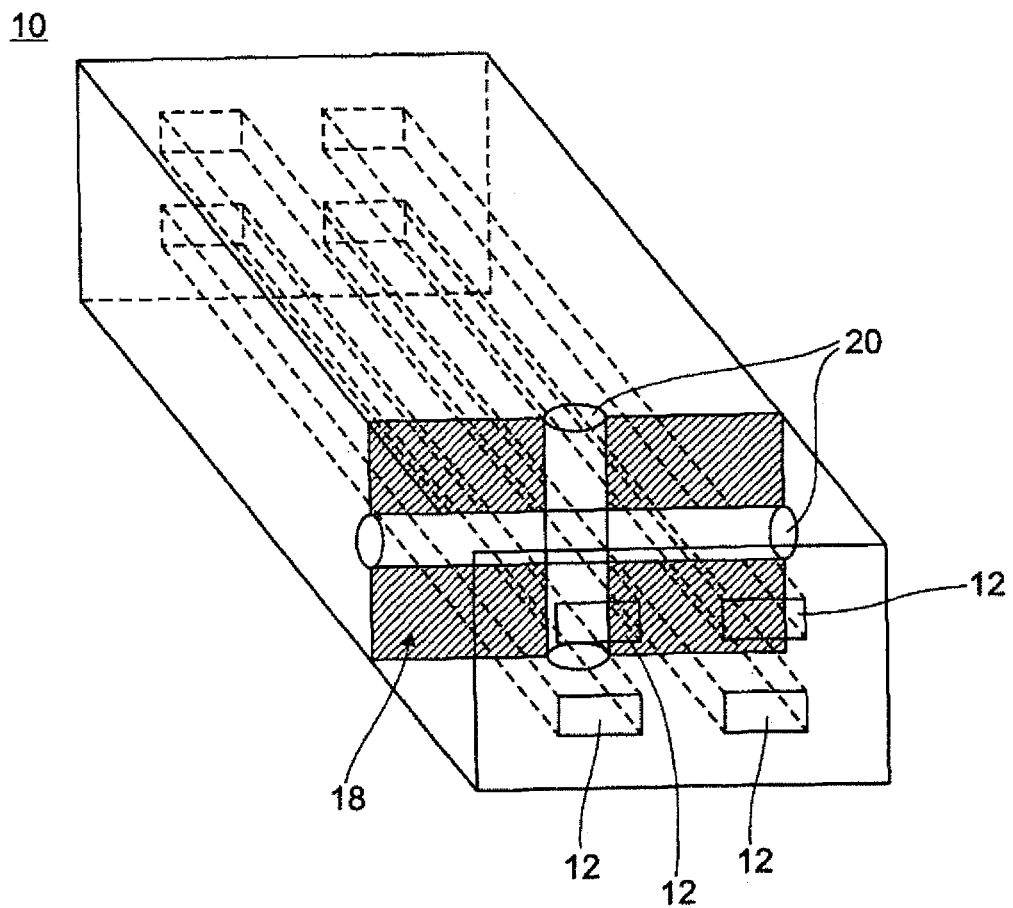

FIG. 1 conductor paths for the production for production of a plastic injection overmolded conductor path structure;

FIG. 2 the conductor paths of FIG. 1 after to a further method step;

FIG. 3 The conductor paths of FIG. 2 after a further method step;

FIG. 4 the conductor paths of FIG. 3 with highlighted contact surfaces and FIG. 5 the plastic injection overmolded conductor path structure according to the invention.

DETAILED DESCRIPTION OF PREFERRED EMBODIMENTS

FIG. 1 to FIG. 5 show the individual method steps for producing a plastic injection overmolded conductor path structure according to the invention generally designated with reference numeral 10.

The starting point—as can be seen from FIG. 1—is a stamped metal sheet, which forms the conductor paths 12. The conductor paths 12 are hereby still connected with each other via connecting webs 14 in order to prevent the conductor paths 12 from falling apart.

FIG. 1 only shows the position of the conductor paths 12. Only for the sake of completeness it is noted that in the conductor path structure to be produced multiple layers of these conductor paths can be arranged above and/or adjacent each other.

In a next method step the conductor paths of FIG. 1 are inserted into an injection molding tool and a pre-overmodling is applied on the conductor paths 12 in a first injection molding process. By the pre injection overmolding first housing sections 16 are produced which are intended to ensure a falling apart of the conductor paths 12 in the absence of the connecting webs 14. In the present case two first housing sections 16 are shown which are separate from each other when viewed in longitudinal direction 1. In the pre-injection overmolding the connecting webs 14 are avoided. In addition the pre-injection overmolding—as can be clearly seen in FIG. 2—is exclusively limited to the produced first housing sections 16, i.e., the regions of the conductor paths 12 that lie between the first housing sections are not overmolded.

In the following method step the connecting webs 14 are removed. This can for example be accomplished by stamping, cutting or bending. As can be seen from FIG. 3 the conductor paths 12 are spaced apart from each other in a defined manner due to the first housing sections 16.

The regions of the conductor paths 12, which lie between the first housing sections 16 and which are not yet overmolded are overmolded with plastic in a subsequent method step.

For this purpose the conductor paths 12, which are fixed to each other via the first housing sections 16, are inserted into an injection molding tool and a main injection overmolding is applied between the first housing sections 16 in a second injection molding step. As a result of the main injection overmolding second housing sections are formed. Because the second housing sections formed by the main injection overmolding border directly on the first housing sections 16 the first and second housing sections have contact surfaces 18.

These contact surfaces 18 between the pre- and main injection overmolding, which may lead to short circuits, are shown in FIG. 4.

FIG. 5 shows the plastic injection overmolded conductor path structure 10 after the main injection overmolding and introduction of material recesses 20 in the contact surface 18. In the present case the material recesses are configured as bores.

As a result of the configuration according to the invention it is now ensured that in the region of the contact surface 18 between the two housing sections large amounts of liquid can enter-/exit/-pass through the bores 20 so that the formation of a microfilm is avoided and the risk of a short circuit is significantly reduced.

In a not shown embodiment of the invention the hole/opening in the housing surface can be filled with a mass and thereby sealed. This can be advantageous for example when there is a risk that a conductor path is no longer surrounded by a sufficiently thick plastic layer. This can have the advantage that for example the risk of short circuits caused by contaminant particles is reduced, which may adhere there and may also cause short circuits.

What is claimed is:

1. A plastic injection overmolded conductor path structure, comprising: conductor paths; and a housing made of plastic and completely enclosing the conductor paths except for connections of the conductor paths, said housing having first housing sections produced in a first injection overmolding step and second housing sections produced in a second injection overmolding step, said second housing sections directly bordering the first housing sections via a contact surface, said housing, in a region of the contact surface, being provided with at least one material recess having a defined shape and size.

2. The conductor path structure of claim 1, wherein the material recess is formed by a bore which is introduced from outside the housing into the housing surface and forms at least one entry opening.

3. The conductor path structure of claim 2, wherein the bore is configured as a through-bore or as a blind bore.

4. The conductor path structure of claim 2, wherein the entry opening in the housing surface is closed by a closure element.

5. The conductor path structure of claim 4, wherein the closure means is configured as a cast mass.

6. A method for producing a conductor path structure that is enclosed by a housing made of plastic material, said method comprising:

producing conductor paths from a metal sheet, wherein the individual ones of the conductor paths are connected with each other via metallic connecting webs;

inserting the conductor paths into a plastic injection molding tool and applying a pre-injection overmolding made of a plastic material, so as to produce at least two housing sections, said at least two housing sections when viewed in a longitudinal direction of the conductor paths being configured separate and fixing the conductor paths with each other, said at least two housing sections being positioned spaced apart from the connecting webs, said pre-injection overmolding being limited to exclusively the first housing sections so that regions of the conductor paths situated between the two first housing sections are avoided;

removing the connecting webs;

inserting the conductor paths that are fixed to each other in spaced apart relationship via the first hosing sections into a plastic injection molding tool;

applying a main injection overmolding made of a plastic material, so as to produce second housing sections which directly border the first housing sections via contact surfaces and which completely enclose the avoided regions of the conductor paths; and introducing a material recess in a region of the contact surface between first and second housing sections.

7. The method of claim 6, wherein the material recess is introduced by a corresponding configuration of the plastic injection molding tool when applying the main injection overmolding.

8. The method of claim 5, wherein the material recess (20) is introduced after the application of the main injection overmolding by a material removing manufacturing process.

9. The method of claim 8, wherein the material recess is introduced by means of drilling, stamping, laser cutting or water jet cutting.

10. The method of claim 6, further comprising closing an entry opening formed by the material recess in the housing surface.

11. The method of claim 10, wherein the entry opening is closed by means of casting with a cast mass.

* * * * *